(12) United States Patent
Roveda et al.

(10) Patent No.: US 7,656,676 B2
(45) Date of Patent: Feb. 2, 2010

(54) REMOVABLE DATA STORAGE DEVICE AND RELATED ASSEMBLING METHOD

(76) Inventors: Marco Roveda, Via Ticino, 33/22, Motta Visconti (IT) 20086; Davide Villa, Via Pitagora, 25, Monza (IT) 20052; Romina Zonca, Corso Garibaldi, 36, Milano (IT) 20121; Stefano Ghezzi, Via G, Verga, 4, Treviolo (IT) 24048; Stefano Saltutti, Via Valsorda, 50, Gualdo Tadino (IT) 06023; Luigi Costanzo, Via Dante, 19, Lusciano (IT) 81030

( * ) Notice: Subject to any disclaimer, the term of this patent is extended or adjusted under 35 U.S.C. 154(b) by 0 days.

(21) Appl. No.: 11/344,519

(22) Filed: Jan. 31, 2006

(65) Prior Publication Data

US 2006/0176673 A1  Aug. 10, 2006

(30) Foreign Application Priority Data

Jan. 31, 2005  (IT)  ................ MI2005A0139

(51) Int. Cl.
*H05K 5/00* (2006.01)
(52) U.S. Cl. ............ 361/756; 361/684; 361/727; 361/730; 361/737
(58) Field of Classification Search .......... 174/521; 361/733, 737, 752, 756, 757, 727, 730, 785, 361/684; 711/115, 103; 439/76.1, 79, 660, 439/906, 610; 365/51, 52, 63, 200, 43, 44; 710/62, 305; 257/723, 787; 438/107, 117; 29/412, 417, 623.5, 841
See application file for complete search history.

(56) References Cited

U.S. PATENT DOCUMENTS

| | | | | |
|---|---|---|---|---|
| 4,905,124 A * | 2/1990 | Banjo et al. | ............... | 361/737 |
| 5,155,663 A * | 10/1992 | Harase | ............... | 361/684 |
| 5,225,968 A * | 7/1993 | Ma | ............... | 361/791 |
| 5,635,756 A * | 6/1997 | Kohno et al. | ............... | 257/676 |
| 6,121,681 A * | 9/2000 | Tanaka et al. | ............... | 257/723 |
| 6,137,710 A * | 10/2000 | Iwasaki et al. | ............... | 365/52 |
| 6,323,064 B1 * | 11/2001 | Lee et al. | ............... | 438/117 |
| 6,552,423 B2 * | 4/2003 | Song et al. | ............... | 257/679 |
| 6,590,850 B2 * | 7/2003 | Eldredge et al. | ............... | 369/101 |
| 6,624,005 B1 * | 9/2003 | DiCaprio et al. | ............... | 438/113 |
| 6,854,984 B1 * | 2/2005 | Lee et al. | ............... | 439/79 |
| 6,867,485 B2 * | 3/2005 | Wallace | ............... | 257/679 |
| 6,938,227 B2 * | 8/2005 | Murphy et al. | ............... | 716/1 |
| 6,948,983 B1 * | 9/2005 | Peng | ............... | 439/660 |
| 6,962,613 B2 * | 11/2005 | Jenson | ............... | 29/623.5 |
| 6,994,568 B2 * | 2/2006 | Huang et al. | ............... | 439/76.1 |
| 7,004,794 B2 * | 2/2006 | Wang et al. | ............... | 439/660 |
| 7,008,240 B1 * | 3/2006 | Wang et al. | ............... | 439/76.1 |
| 7,021,971 B2 * | 4/2006 | Chou et al. | ............... | 439/660 |
| 7,032,827 B2 * | 4/2006 | Wang et al. | ............... | 235/492 |
| 7,035,110 B1 * | 4/2006 | Wang et al. | ............... | 361/737 |

(Continued)

*Primary Examiner*—Ishwarbhai B Patel
*Assistant Examiner*—Xiaoliang Chen
(74) *Attorney, Agent, or Firm*—Trop, Pruner & Hu, P.C.

(57) ABSTRACT

A removable storage device includes a substrate whereon a plurality of components are arranged. Advantageously, the removable storage device comprises a casing of the package type suitable to completely cover these components and to form, together with the substrate, an external coating of the removable storage device. Moreover, a method is described for assembling at least one removable storage device thus realized.

13 Claims, 4 Drawing Sheets

U.S. PATENT DOCUMENTS

| | | | |
|---|---|---|---|
| 7,044,802 B2 * | 5/2006 | Chiou et al. | 439/660 |
| 7,052,287 B1 * | 5/2006 | Ni et al. | 439/76.1 |
| 7,062,585 B2 * | 6/2006 | Chen | 710/301 |
| 7,068,517 B2 * | 6/2006 | Yen | 361/752 |
| 7,089,661 B2 * | 8/2006 | Fong et al. | 29/841 |
| 7,094,074 B2 * | 8/2006 | Chiou et al. | 439/79 |
| 7,104,848 B1 * | 9/2006 | Chou et al. | 439/660 |
| 7,108,560 B1 * | 9/2006 | Chou et al. | 439/660 |
| 7,125,287 B1 * | 10/2006 | Chou et al. | 439/660 |
| 7,151,673 B2 * | 12/2006 | Le et al. | 361/737 |
| 7,182,646 B1 * | 2/2007 | Chou et al. | 439/660 |
| 7,186,147 B1 * | 3/2007 | Chou et al. | 439/660 |
| 7,235,423 B1 * | 6/2007 | Wang et al. | 438/107 |
| 7,301,776 B1 * | 11/2007 | Wang et al. | 361/737 |
| 2001/0015485 A1 * | 8/2001 | Song et al. | 257/679 |
| 2001/0038547 A1 * | 11/2001 | Jigour et al. | 365/43 |
| 2002/0021596 A1 * | 2/2002 | Rolandi | 365/200 |
| 2002/0030256 A1 * | 3/2002 | Lee et al. | 257/676 |
| 2002/0116668 A1 * | 8/2002 | Chhor et al. | 714/42 |
| 2002/0147882 A1 * | 10/2002 | Pua et al. | 711/103 |
| 2003/0137859 A1 * | 7/2003 | Sugawara | 365/51 |
| 2004/0038592 A1 | 2/2004 | Yang | 439/638 |
| 2004/0083320 A1 * | 4/2004 | Yu | 710/62 |
| 2004/0089717 A1 * | 5/2004 | Harari et al. | 235/441 |
| 2004/0153595 A1 * | 8/2004 | Sukegawa et al. | 710/305 |
| 2005/0059301 A1 * | 3/2005 | Chou et al. | 439/660 |
| 2005/0070138 A1 * | 3/2005 | Chiou et al. | 439/76.1 |
| 2005/0085133 A1 * | 4/2005 | Wang et al. | 439/660 |
| 2005/0156333 A1 * | 7/2005 | Chiou et al. | 257/787 |
| 2005/0164532 A1 * | 7/2005 | Ni et al. | 439/79 |
| 2006/0023433 A1 * | 2/2006 | Lin | 361/752 |

* cited by examiner

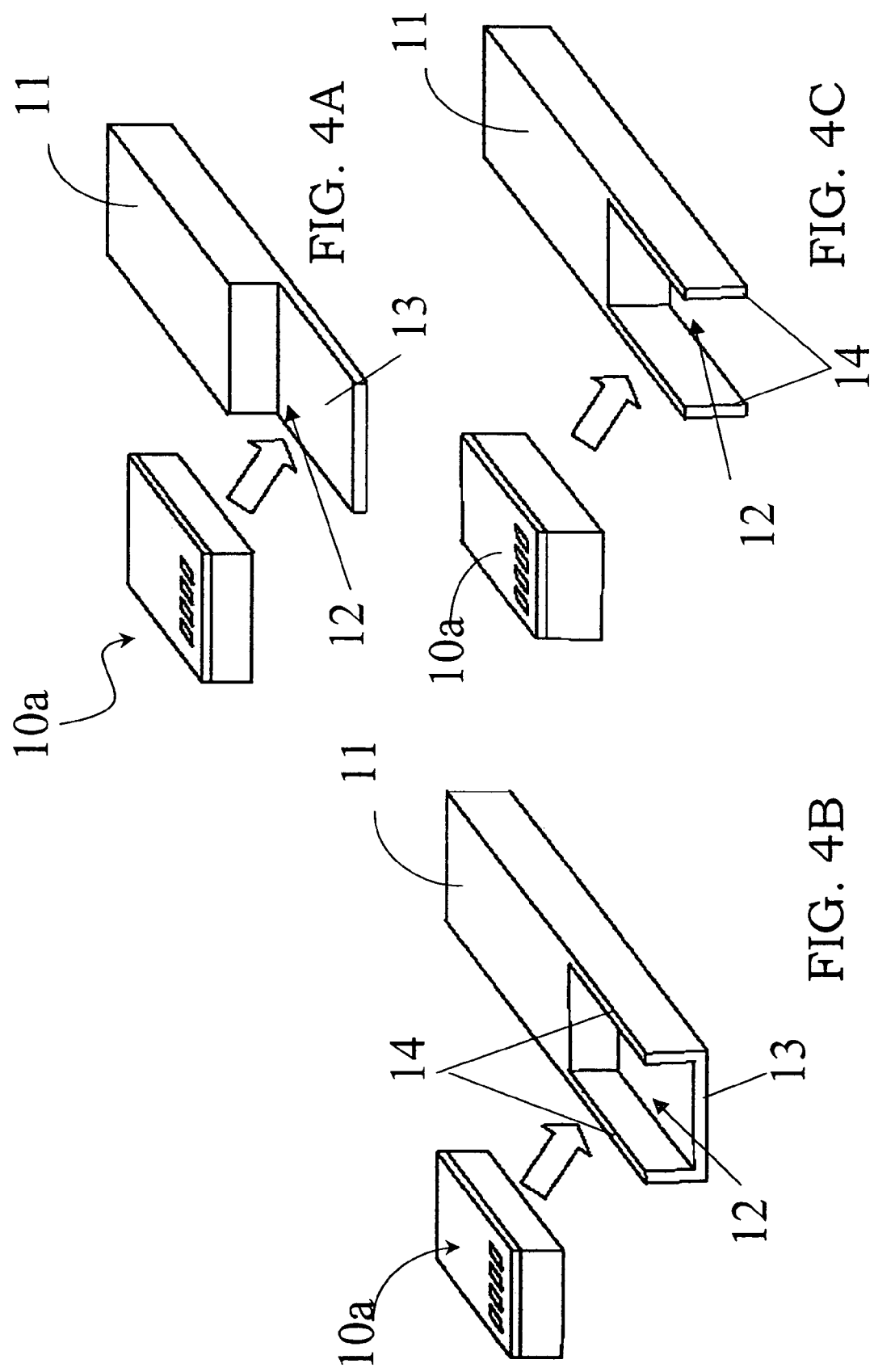

REMOVABLE DATA STORAGE DEVICE AND RELATED ASSEMBLING METHOD

BACKGROUND OF THE INVENTION

1. Field of the Invention

The present invention relates to a removable data storage device.

More specifically, the invention relates to a removable storage device comprising at least one substrate whereon a plurality of components are arranged.

More in particular the present invention relates to a removable data storage device of the USB type and the following description is made with reference to this field of application by way of illustration only.

2. Description of the Related Art

As it is well known, data storage devices of the removable type, such as USB peripherals (acronym of the English: "universal serial bus") or Flash cards, are currently realized by mounting, on small and thin printed circuit boards or PCBs (acronym of the English: "printed circuit board"), silicon-based components incorporated in suitable packages, such as memories and ASICs (acronym of the English: "application specific integrated circuit") just as non-silicon components, such as passive components and crystals.

To assemble these components traditional assembling techniques are generally used for PCBs, remarkably improved in time but however always limited due to the physical constraints linked to the dimensions of the single packages and to the physical realization of the PCB itself. These constraints impose in particular limits to the reduction of the integration scale of the storage devices as a whole.

On the contrary, market needs currently require data storage devices with higher and higher densities and lower and lower form factors, up to the desired limit of the hard disk on silicon.

This trend is also followed by packaging technologies offering very complex and state-of-the-art approaches to decrease the dimensional impact of the single packages.

In particular, using these "packaging" technologies is known for the manufacturing of MMC™ boards (acronym of the trademark: "MultiMediaCard™") providing, after a molding process similar to the one used to obtain an SMD component (acronym of the English "Surface Mounted Device") and wherein the separation (singling) of each package is carried out by means of mechanical blanking before the application of a cover, that the final packaging step is carried out by using a supplemental plastic cover which is constrained, by means of adhesive, to a substrate of the MMC board and to the forming mold.

A package is thus obtained which can be shaped according to a specific profile, as needed for MMC boards. In particular, rounded edges are obtained with a suitable shape of this plastic cover.

It is however remarked that, even if this advanced packaging technology allows one to use a manufacturing line of SMD components also for the manufacturing of MMC boards, some difficulties in the singling and finishing operations remain.

In these last years, remarkable progresses have been made in the laser cutting process on organic materials such as the material as substrate. The laser cutting is a very interesting solution for the singling of MMC boards, especially because the profile is neither squared nor rectangular.

However, the problem of obtaining rounded edges remains, and the standard laser cutting technique does not ensure this particular shaping of the substrate whereon the MMC board is realized.

In general, these technologies are extremely expensive and they are currently used only for devices with very high density having a very high cost in terms of silicon and thus not suffering, in their final price, from the packaging costs.

The same approach has thus not been used so far for low density storage devices for which the impact of the packaging cost would be comparable to the cost in silicon and thus non realistic on an industrial scale.

Storage devices of the USB type, i.e., devices using communication protocols according to this USB standard, are the most diffused and the most suitable ones to realize removable storage devices with high density, in other words the desired removable hard disk.

BRIEF SUMMARY OF THE INVENTION

One embodiment of the present invention provides a removable data storage device, in particular of the USB type, having such structural and functional characteristics as to allow to overcome the limits and drawbacks still affecting the devices realized according to the prior art.

One embodiment of the present invention provides the removable storage device with a casing of the package type able to realize, at the same time, the package for the components of the storage device and the desired external coating of the device itself.

One embodiment of the invention is a removable storage device that includes:

a substrate whereon a plurality of electrical components are arranged; and a package casing suitable to completely cover said components and to form, together with said substrate, an external coating of said removable storage device.

One embodiment of the invention is a method for assembling a removable storage device that includes:

arranging a plurality of components on a substrate; and realizing a package casing suitable to cover the components, said casing forming with said substrate an external coating of said removable storage device.

The characteristics and the advantages of the removable storage device and of the assembling method according to the invention will be apparent from the following description of embodiments thereof given by way of indicative and non-limiting example with reference to the annexed drawings.

BRIEF DESCRIPTION OF THE SEVERAL VIEWS OF THE DRAWINGS

FIGS. 4A-4C schematically show embodiments of the storage device of FIG. 1.

DETAILED DESCRIPTION OF THE INVENTION

Figure 1:
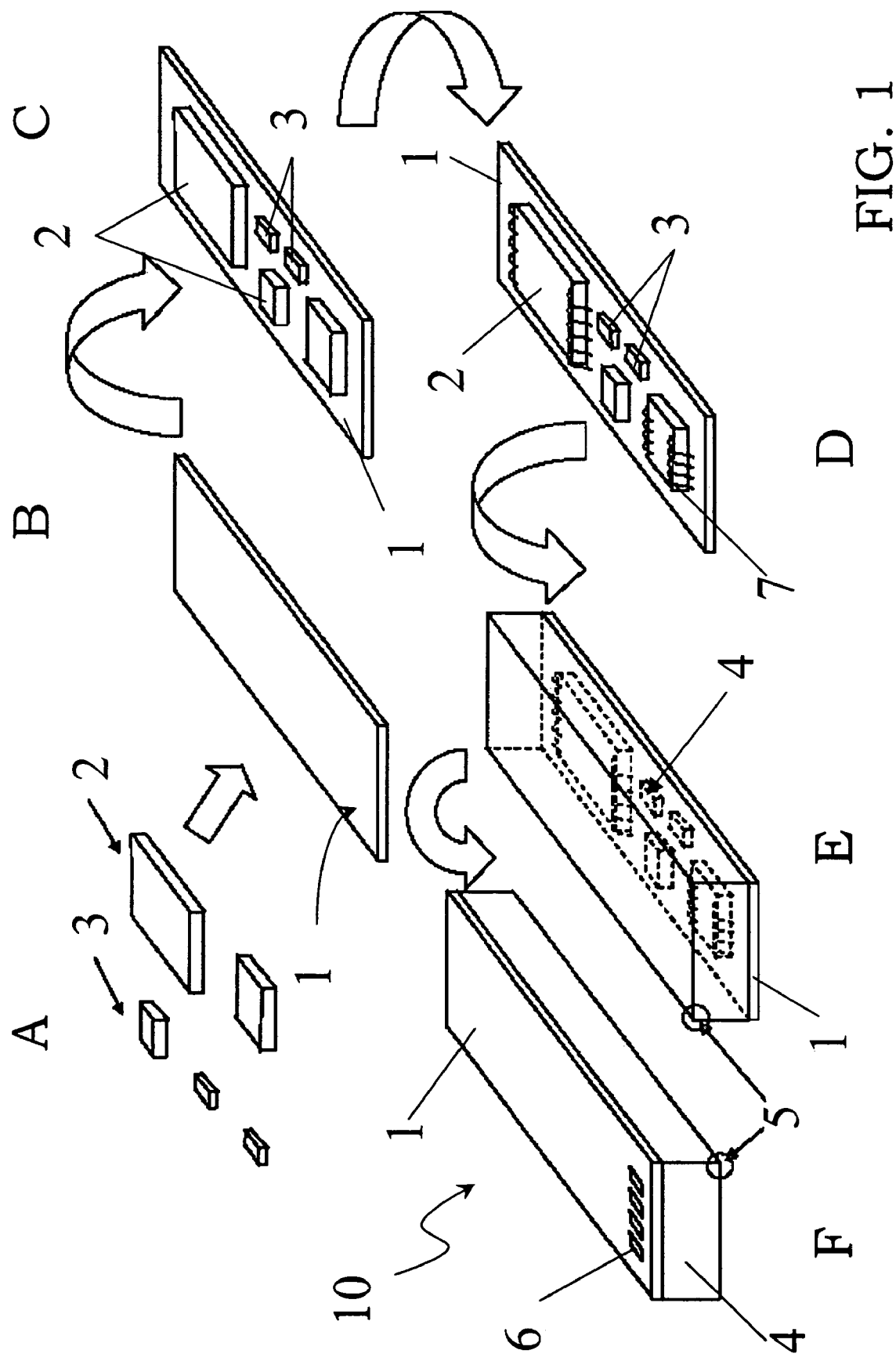
FIG. 1 schematically shows the removable storage device realized according to the invention during different steps of the assembling method according to the invention.

With reference to these figures, and in particular to the example of FIG. 1, 10 globally and schematically indicates a removable storage device realized according to one embodiment of the invention.

The removable storage device 10 comprises a substrate 1, which is a PCB, whereon a plurality of components 2, 3 of the silicon and non-silicon type, respectively, are arranged.

Advantageously, the removable storage device 10 also comprises a casing 4 of the package type. Suitably, this casing 4 completely covers the components 2, 3 of the removable storage device 10.

Moreover, advantageously, the casing 4 extends above the entire substrate 1 of the removable storage device 10 and it is in contact with it, having suitably chosen dimensions to realize a removable storage device 10 of the desired dimensions. In substance, the dimensions of the casing 4 in plan are equal to the dimensions of the substrate 1.

The removable storage device 10 also comprises contact pads 6 realized in said substrate 1.

In a preferred embodiment of the removable storage device 10 according to the invention and shown in FIG. 1, the casing has a substantially parallelepiped-like shape.

In particular, the casing 4 has edges 5 suitable to be rounded when needed. Alternatively, a mold for realizing the casing 4 is used already providing suitable roundings in correspondence with the edges 5.

In substance, the removable storage device 10 comprises a plurality of "naked" components, i.e., not equipped with single packages, suitably arranged on a substrate and advantageously incorporated in a single casing 4 of the package type which realizes, at the same time, together with the substrate 1, the external coating of the removable storage device 10 itself.

Advantageously, the removable storage device 10 is realized so as to use a universal communication protocol, such as the USB protocol which is currently the mainly used protocol especially among storage units with high capacity (hard disk and USB cards used as an extractable hard disk).

To assemble this removable storage device 10, the assembling method according to one embodiment of the invention, as shown in FIG. 1, provides the following steps:

prearranging a plurality of components 2, 3 of the silicon and non-silicon type, respectively (indicated with A in FIG. 1);

prearranging a substrate 1 (indicated with B in FIG. 1); and arranging the components 2, 3 on the substrate 1 (indicated with C in FIG. 1).

In particular, this arranging step of the components 2, 3 on the substrate 1 comprises a fixing and sealing step of these components, in a way known to the technician of the field.

The assembling method can also provide a step of:

electrical connection of at least one of these components 2, 3 to the substrate 1 by means of a plurality of wires 7—the so called bonding—(indicated with D in FIG. 1).

Advantageously, the components 2, 3 do not have single containment packages and the method further comprises the step of:

realizing a casing 4 of the package type suitable to cover the components 2, 3 (indicated with E in FIG. 1).

In particular, the casing 4 is obtained, for example, by means of molding of a suitable plastic material or of a resin.

Moreover, this realization step of the casing 4 provides a dimensioning of the casing itself so as to obtain a removable storage device 10 having the desired dimensions.

Moreover, the casing 4 is suitably realized in contact with the substrate 1 forming with it the external coating of the removable storage device 10.

In this way the removable storage device 10 is fully assembled as indicated with F in FIG. 1.

Finally, the assembling method can provide a final step of:

shaping the casing 4 to obtain a desired shape for the removable storage device 10.

Alternatively, a mold is used to realize the casing 4 which allows to obtain the desired shape, for example already providing suitable roundings in correspondence with the edges 5.

In particular, this shaping step comprises for example a rounding step of the edges 5.

Advantageously, the assembling method can be used also to simultaneously realize a plurality of removable storage devices, being, in this way, more convenient on an industrial scale.

Figure 2:
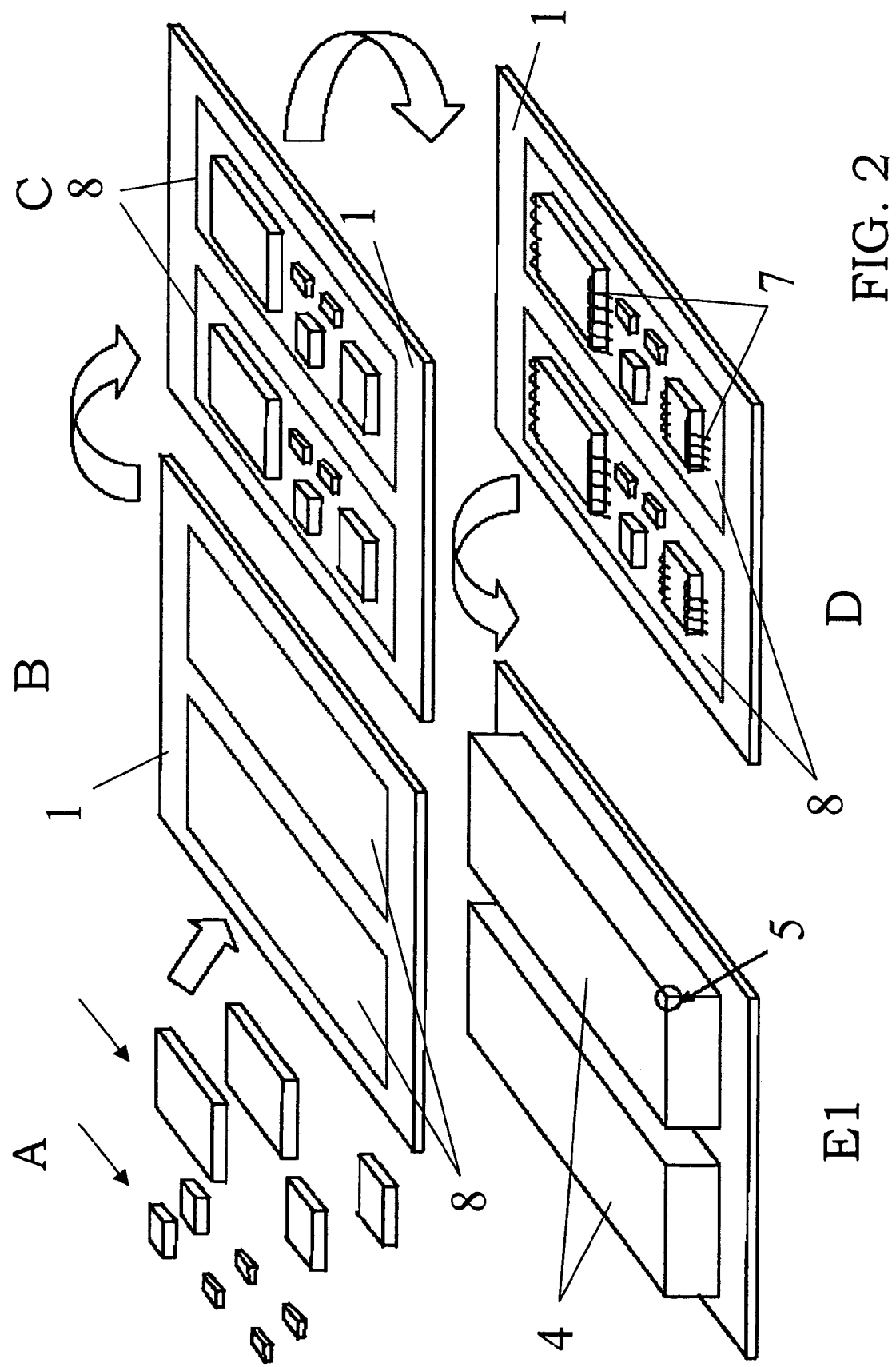
FIG. 2 schematically shows a plurality of storage devices realized according to the invention during different steps of a further version of the assembling method according to the invention.
Figure 3:
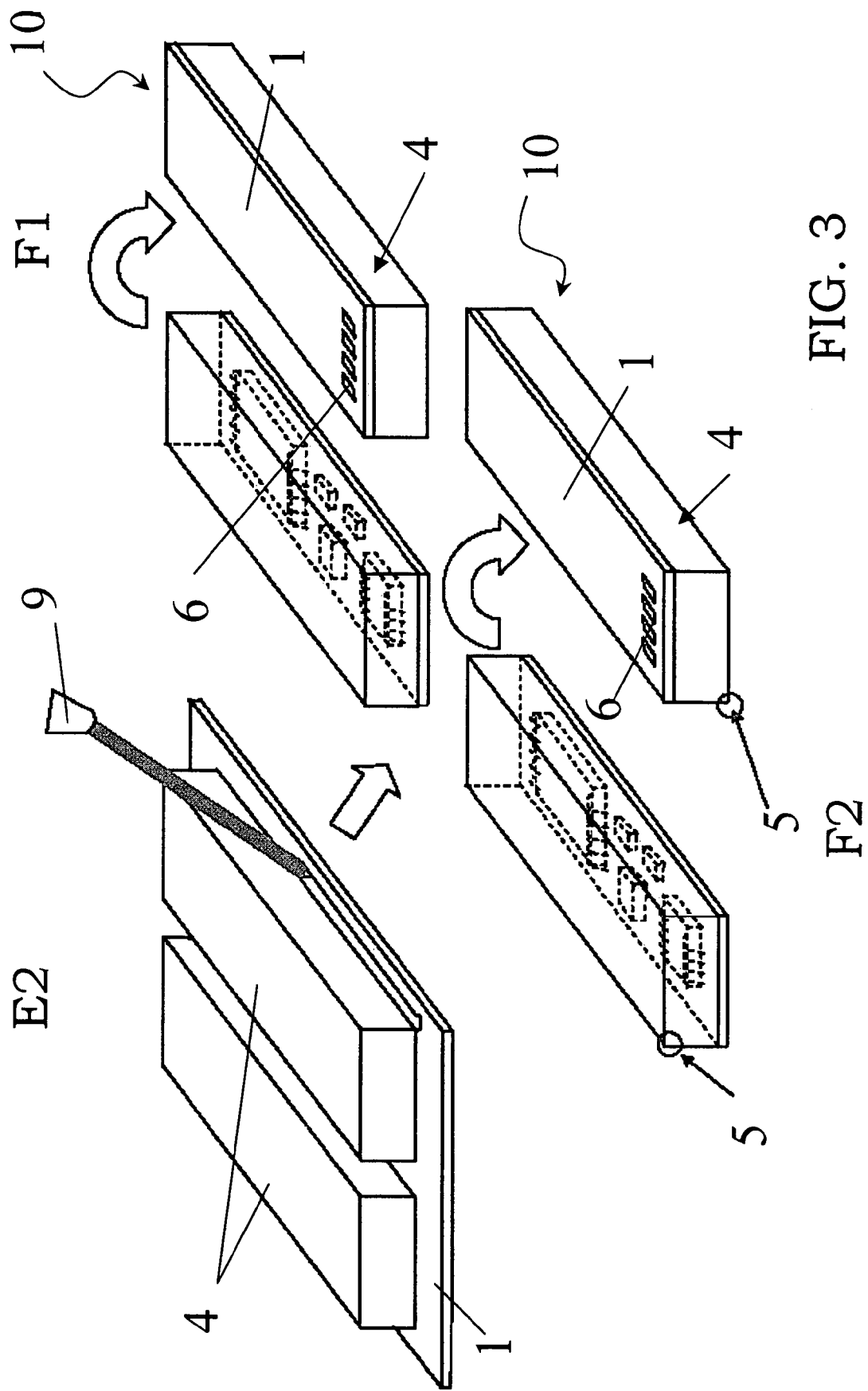
FIG. 3 schematically shows the plurality of storage devices of FIG. 2 during further steps of the further version of the assembling method according to the invention.

An assembling method of assembling a plurality of removable storage devices according to one embodiment of the invention is shown in FIGS. 2 and 3 and it provides the steps of:

prearranging a plurality of components 2, 3 of the silicon and non-silicon type, respectively (indicated with A in FIG. 2);

prearranging a substrate 1 whereon a plurality of areas 8 are defined (indicated with B in FIG. 2); and arranging the components 2, 3 on the areas 8 of the substrate 1 (indicated with C in FIG. 1).

In particular, as seen in relation with the assembling method of a single removable storage device 10, the arranging step of the components 2, 3 on the substrate 1 comprises a fixing and sealing step of these components, in a way known to the technician of the field. An additional electric connection step of at least one of these components 2,3 to the substrate 1 by means of a plurality of wires 7—the so called bonding—(indicated with D in FIG. 2) can also be provided.

Advantageously, the components 2, 3 do not have single containment packages and the method further comprises the step of:

realizing a plurality of casings 4 of the package type suitable to cover the components 2, 3 (indicated with E1 in FIG. 2).

The plurality of casings 4 is obtained, for example, by molding a suitable plastic material or a resin.

Moreover, as already seen, the casings 4 are advantageously dimensioned so as to obtain a plurality of removable storage devices 10 having the desired dimensions.

The assembling method of a plurality of removable storage devices 10 according to the invention also provides a step of:

singling the removable storage devices 10 by means of laser cutting in correspondence with the areas 8 of the substrate 1 (indicated with E2 in FIG. 3).

This laser cutting is realized by using a laser tool 9 able to "cut" the areas 8 on the substrate 1 and to separate them, together with the casings 4, so as to obtain a plurality of removable storage devices 10, as indicated with F1 and F2 in FIG. 3.

In particular, the casings 4 are suitably realized in contact with the areas 8 of the substrate 1 to form with them, after the singling step, the external coatings of the removable storage devices 10 thus obtained.

It is to be noted that the singling step, by means of laser cutting, is carried out at the end of the assembling process and it succeeds in adapting to the progressive decrease of the physical dimension of the devices which are to be realized. This laser cutting step, which would remarkably affect the working cost of a single device with respect to a standard process, such as a mechanical cutting, is, in reality, advantageous in the method described above since it is applied to a plurality of devices already assembled on a single substrate.

Moreover, the cost of the substrate 1 being a main part of the total cost of the removable storage device 10, advantageous embodiments of the removable storage device 10 according to the invention are shown in FIG. 4A-4C.

In particular, the removable storage device 10 comprises a device 10a of reduced dimensions with respect to the final dimensions which are to be obtained.

The device 10a of reduced dimensions is realized on a substrate area 8 of reduced dimensions and it is associated with an additional casing 11, in particular of the plastic type, equipped with a housing 12 having such dimensions as to realize, together with the device 10a of reduced dimensions, a removable storage device 10 having the desired dimensions.

In this way, in fact, the device 10a of reduced dimensions requires lower areas 8 of substrate 1 for its realization, reducing the manufacturing cost, which is only minimally affected by the realization cost of the additional casing 11.

In particular, in FIG. 4A, this additional casing 11 has a housing 12 comprising a base 13 of dimensions substantially corresponding to those of the area 8 of substrate of the device 10a of reduced dimensions.

Similarly, in FIG. 4B, the additional casing 11 has a housing 12 comprising a base 13 of dimensions substantially corresponding to those of the area 8 of substrate of the device 10a of reduced dimensions and side walls 14 having length substantially corresponding to the length of the base 13 and height substantially corresponding to the height of the device 10a of reduced dimensions.

Finally, in FIG. 4C, the additional casing 11 has a housing 12 comprising side walls 14 having length and height substantially corresponding to the length and height of the device 10a of reduced dimensions.

It is to be noted that the correspondence of the dimensions as above indicated must obviously take into account the working tolerances of the pieces.

In any case, the housing 12 made in the additional casing 11 must be dimensioned, taking into account these tolerances, so as to contain the device 10a of reduced dimensions. Moreover the additional casing 11 itself must be dimensioned so as to realize, together with the device 10a of reduced dimensions, a removable storage device 10 having the desired final dimensions.

In conclusion, the removable storage device 10 has the following advantages:

it allows to realize storage units with low capacity and low cost;

it allows to use components which are not equipped with single packages;

it simplifies the assembling process of the devices;

it simplifies the realization of the external coating of the single devices;

in its embodiments, it reduces the material used for the substrate with abatement of the costs relative to the single removable storage devices thus obtained.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A removable storage device, comprising:
   a substrate whereon a plurality of electrical components are arranged; and a package casing suitable to completely cover said components, said package casing having exposed electrical contacts;
   wherein the components, the substrate and the package casing comprise a device of reduced dimensions with respect to desired dimensions for said removable storage device, with the removable storage device further comprising an additional casing having such dimensions so as to realize, together with said device of reduced dimensions, a removable storage device having said desired dimensions, said additional casing having no electrically functional element; and
   wherein said contacts, and at least portions of each of the substrate, the package casing and the additional casing are exposed to form an external surface of said removable storage device.

2. The removable storage device according to claim 1 wherein said package casing entirely extends above and contacts said substrate.

3. The removable storage device according to claim 1 wherein said components do not have single containment packages.

4. The removable storage device according to claim 1 wherein said package casing is realized in plastic material.

5. The removable storage device according to claim 1 wherein said package casing is realized in resin.

6. The removable storage device according to claim 1, further comprising contact pads realized in said substrate.

7. The removable storage device according to claim 1 wherein said package casing has a substantially parallelepiped-like shape.

8. The removable storage device according to claim 1 wherein said package casing has a substantially parallelepiped-like shape with rounded edges.

9. The removable storage device according to claim 1 wherein it uses a universal communication protocol.

10. The removable storage device according to claim 1 wherein said device of reduced dimensions is housed in a housing made in said additional casing.

11. The removable storage device according to claim 10 wherein said housing comprises a base of dimensions substantially corresponding to those of said device of reduced dimensions.

12. The removable storage device according to claim 10 wherein said housing comprises:
   a base of dimensions substantially corresponding to those of said device of reduced dimensions; and
   side walls having a length substantially corresponding to a length of said base and a height substantially corresponding to a height of said device of reduced dimensions.

13. The removable storage device according to claim 10 wherein said housing comprises side walls having a length and a height substantially corresponding to a length and a height of said device of reduced dimensions.

* * * * *